US008669584B2

(12) United States Patent
Sato et al.

(10) Patent No.: US 8,669,584 B2
(45) Date of Patent: Mar. 11, 2014

(54) LIGHT EMITTING DEVICE INCLUDING A CASE HAVING AN ACCOMMODATING RECESSION

(75) Inventors: Makoto Sato, Kiyosu (JP); Satoshi Ota, Kiyosu (JP); Masakata Koseki, Kiyosu (JP)

(73) Assignee: Toyoda Gosei Co., Ltd., Kiyosu-shi, Aichi-ken (JP)

( * ) Notice: Subject to any disclaimer, the term of this patent is extended or adjusted under 35 U.S.C. 154(b) by 0 days.

(21) Appl. No.: 13/587,699

(22) Filed: Aug. 16, 2012

(65) Prior Publication Data

US 2013/0077321 A1   Mar. 28, 2013

(30) Foreign Application Priority Data

Sep. 27, 2011   (JP) .................................. 2011-211684

(51) Int. Cl.
*H01L 33/00*   (2010.01)

(52) U.S. Cl.
USPC ....................................................... 257/100

(58) Field of Classification Search
USPC ....................................................... 257/100
See application file for complete search history.

(56) References Cited

U.S. PATENT DOCUMENTS

| 5,733,659 | A | 3/1998 | Iwakiri et al. |
| 2007/0299169 | A1* | 12/2007 | Ohira et al. .................. 524/100 |
| 2008/0173883 | A1* | 7/2008 | Hussell et al. ................. 257/98 |
| 2010/0059782 | A1* | 3/2010 | Fujitomo et al. ............... 257/98 |

FOREIGN PATENT DOCUMENTS

| EP | 0 812 882 A1 | 12/1997 |
| JP | 8-229980 A | 9/1996 |
| JP | 9-235419 A | 9/1997 |
| JP | 2001-057867 A | 3/2001 |
| JP | 4239509 B2 | 3/2009 |
| JP | 2010-100682 A | 5/2010 |

* cited by examiner

*Primary Examiner* — Anthony Ho
(74) *Attorney, Agent, or Firm* — McGinn IP Law Group, PLLC

(57) ABSTRACT

A light emitting device, comprises a LED chip, and a case having an accommodating recession accommodating the LED chip, wherein the light emitting device emits light from an opening portion of the accommodating recession, the case is monolithically formed by injection molding of a resin composition preparing by mixing fine grains of specular reflection material and glass fibers as diffusion reflecting material as fillers therein, an inner surface of a side wall portion of the case works as a reflector that reflects the light emitted from the LED chip so that the light is output from the opening portion, and a thickness of the side wall portion is selected to be smaller than an average length of the glass fibers.

15 Claims, 5 Drawing Sheets

LIGHT EMITTING DEVICE INCLUDING A CASE HAVING AN ACCOMMODATING RECESSION

BACKGROUND OF THE INVENTION

1. Field of the Invention

The present invention relates to a light emitting device. More specifically, the present invention relates to a light emitting device using an LED chip.

2. Description of the Related Art

Conventionally, the following technology is in wide use: glass fibers are blended as a filler in a resin composition to increase the strength of the resin composition (see Patent References 1 through 4).

There is a side view-type light emitting device (side-surface light emitting device) as a thin light emitting device used as the backlight light source of the liquid crystal display, etc. (see Patent Reference 5).
Patent Reference 1: JP-A-2010-100682
Patent Reference 2: JP-A-Hei 8-229980
Patent Reference 3: JP-A-Hei 9-335419
Patent Reference 4: JP-A-2001-57867
Patent Reference 5: Japanese Patent No. 4239509

The technology of using glass fibers for increasing the light reflectivity for the resin composition with glass fibers blended in it is not known.

For example, Patent Reference 3 only describes that the glass fibers improves the optical function of light refraction, scattering, reflection, condensing, etc., and they cause degradation of the polyolefin as the resin composition (see section [0017]).

Also, Patent Reference 4 only describes that when glass flakes are used as an inorganic filler for a transparent composite material containing a transparent resin, glass fibers and the inorganic filler as a resin composition, wetting of the interface between the transparent resin and the glass flakes, light reflection and scattering take place at the surface of the glass flakes, so that transparency degrades (see: sections [0124], [0125]).

In particular, for the side-view-type light emitting device used as the backlight light source of the liquid crystal display, in order to reduce the thickness, it is necessary to reduce the thickness while having a sufficient strength for the side wall of the case of the light emitting device, too.

Consequently, when the case of the side-view-type light emitting device is monolithically formed by means of injection molding of a resin composition in the prior art, glass fibers are blended as a filler in the resin composition to increase the strength of the product for sale.

Here, for the side wall of the case that functions as a reflector of the side-view-type light emitting device, glass fibers should be used to increase the light reflectivity.

SUMMARY OF THE INVENTION

The purpose of the present invention is to solve the aforementioned problems of the prior art by providing a light emitting device that uses glass fibers blended as a filler in the resin composition as the material for forming the case to improve the light reflectivity.

The present inventors have performed extensive researches in order to solve the aforementioned problems. As a result of these researches, the following aspects of the present invention are reached.

<First Aspect>

The first aspect provides a light emitting device including:
an LED chip, and
a case having an accommodating recession for accommodating the LED chip;
the light emitting device emits light from the opening portion of the accommodating recession;
the case is monolithically formed by injection molding of a resin composition preparing by mixing fine grains of specular reflection material and glass fibers as diffusion reflecting material as fillers therein;
the inner surface of the side wall portion of the case works as a reflector that reflects the light emitted from the LED chip so that the light is output from the opening portion; and
the thickness of the side wall portion is selected to be smaller than the average length of the glass fibers.

According to the first aspect, it is possible to realize an appropriate balance between the specular reflected light by the specular reflection material and the diffusion reflected light by the glass fibers, and it is possible to display the optical specificity with which the light of the LED chip can be emitted out from the opening portion at a high efficiency in both the direction of the central axis (axial luminous intensity) between the opposite side wall portions of the case and in the entire peripheral direction (total light beam) of the opening portion of the case.

Consequently, the first aspect provides a side-view-type light emitting device that uses glass fibers mixed as fillers in the resin composition as the material for forming the case to improve the light reflectivity.

<Second Aspect>

The second aspect relates to the light emitting device according to the first aspect, wherein the thickness of the side wall portion is in the range of about 80 µm to about 130 µm, and the average length of the glass fibers is in the range of about 150 µm to about 230 µm.

According to the second aspect, the operation and effect of the first scheme can be realized reliably.

<Third Aspect>

The third aspect relates to the side-view-type light emitting device according to the first or second aspect, wherein the case has a flat rectangular box shape, the side wall faces the width direction of the case, and light is emitted from the opening portion of the accommodating recession in the direction of the side surface of the light emitting device.

<Fourth Aspect>

The fourth aspect relates to the light emitting device according to the first through third aspects, wherein the fine grains of the specular reflection material are dispersed and arranged in the resin composition near the inner surface of the side wall portion, and the glass fibers are almost evenly dispersed and arranged in the resin composition from near the inner surface of the side wall portion to the deep portion.

According to the fourth aspect, it is possible to further improve the specular reflectivity of the fine grains of the specular reflection material, and, at the same time, it is possible to further improve the diffusion reflectivity of the glass fibers as the diffusion reflecting material.

<Fifth Aspect>

The fifth aspect relates to the light emitting device according to the first through fourth aspects, wherein the glass fibers are in a cylindrical shape with a diameter in the range of about 6 µm to about 13 µm, the proportion of the glass fibers in the resin composition is in the range of about 1 wt % to about 40 wt %, and the refractive index of the glass fibers is smaller than the refractive index of the resin composition.

According to the fifth aspect, the operation and effect of the first through fourth aspects can be realized reliably.

<Sixth Aspect>

The sixth aspect relates to the light emitting device according to the first through fifth aspects, wherein the fine grains of the specular reflection material are almost in a spherical shape with a diameter in the range of about 0.1 μm to about 0.3 μm, and the proportion of the fine grains of the specular reflection material in the resin composition is in the range of about 10 wt % to about 50 wt %.

According to the sixth aspect, the operation and effect of the first through fifth aspects can be reliably realized.

BRIEF DESCRIPTION OF THE DRAWINGS

FIG. 1(A) is a front view of the light emitting device 10 as viewed from the light emitting side. FIG. 1(B) is a top view of the light emitting device 10. FIG. 1(C) is a schematic vertical cross-sectional view illustrating the light emitting device 10, and it is a cross-sectional view taken across X-X in FIGS. 1(A), (B).

DESCRIPTION OF THE PREFERRED EMBODIMENTS

An embodiment of the present invention will be explained in the following with reference to the drawings. Here, the drawings show the dimensions, shapes and configuration positions of the structural members in the embodiment in an exaggerated schematic way different from the actual dimensions, shapes and configuration positions of the structural members.

Figure 1:
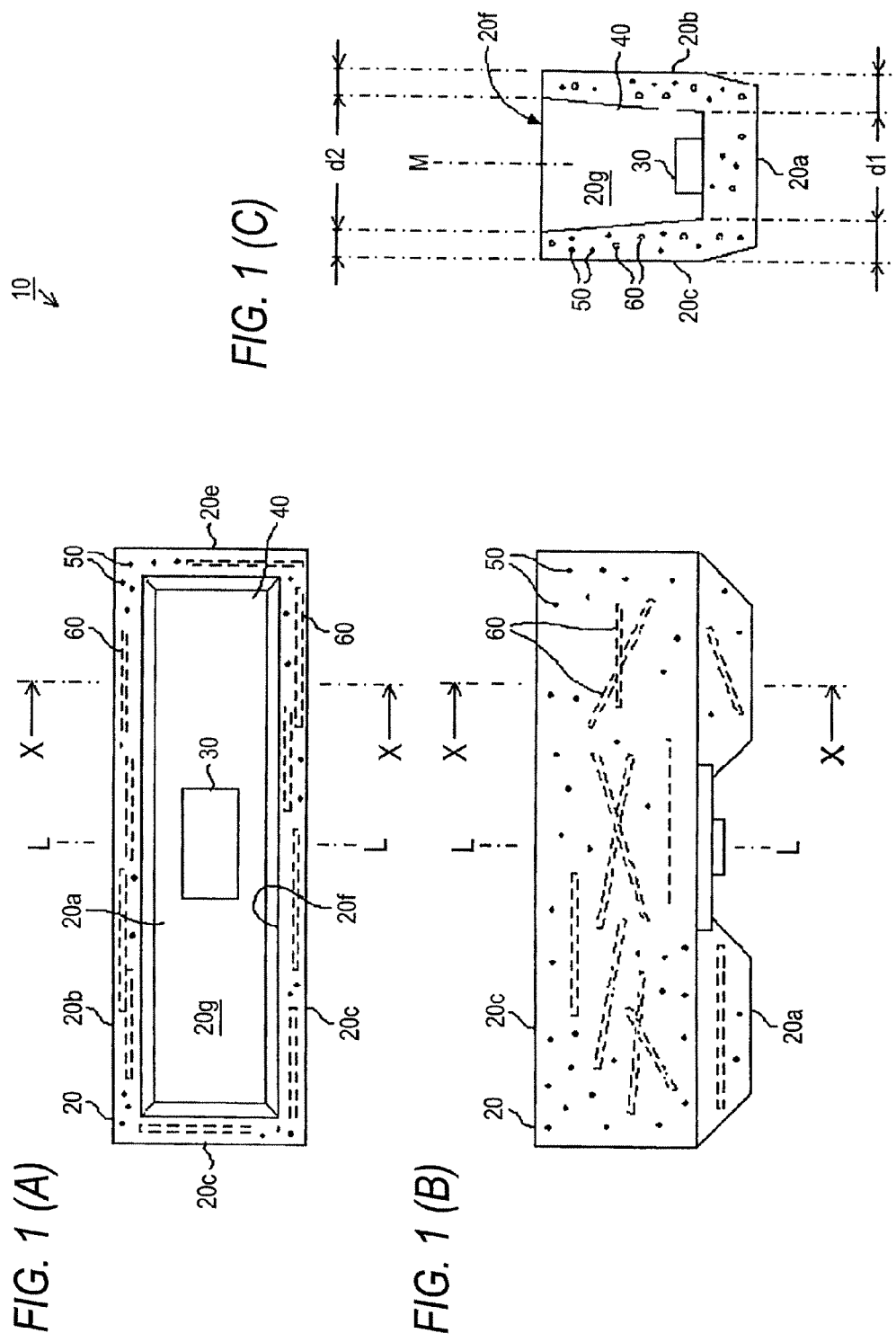
FIG. 1 is a schematic diagram illustrating the light emitting device 10 in an embodiment of the present invention.

As shown in FIG. 1, the light emitting device 10 in the present embodiment includes a case 20 (including a bottom wall portion 20a, side wall portions 20b through 20e, an opening portion 20f, and an accommodating recession 20g), a LED chip 30, a sealing resin 40, titanium oxide fine grains 50 as a specular reflection material, glass fibers 60 as a diffusion reflecting material, etc. It is a side-view-type light emitting device (side surface light emitting device) that emits light in the side wall direction.

The light emitting device 10 has a flat rectangular shape, and it has the case 20 and the LED chip 30 arranged in a line symmetric configuration with respect to the central line (reference line) L that bisects the length and the central line (central axis in the width direction) M that bisects the width.

The case 20 has a flat rectangular box shape, and is formed monolithically by injection molding of a resin composition (a synthetic resin material). The case 20 includes a bottom wall portion 20a and four side wall portions 20b through 20e erected on the outer periphery of the bottom wall portion 20a.

The side surface of the case 20 becomes the opening portion 20f that is fully opened for emitting the light.

The accommodating recession 20g is made of the space defined by the inner surfaces (inner wall surfaces) of the side wall portions 20b, 20c facing each other in the width direction of the case 20, the inner surfaces of the side wall portions 20d, 20e facing each other in the length direction of the case 20, and the inner surface (bottom surface) of the bottom wall portion 20a.

The LED chip 30 is carried as it is attached and anchored on the inner surface of the bottom wall portion 20a of the case 20, and it is accommodated in the accommodating recession 20g of the case 20.

The LED chip 30 is connected with a lead frame (not shown), and the lead frame is inserted and molded in the case 20. The tip portion of the lead frame protrudes outside the case 20 to form the connecting terminal of the light emitting device 10.

The interior of the accommodating recession 20g of the case 20 is filled with the sealing resin 40. The parts accommodated in the accommodating recession 20g (the LED chip 30, the bonding wires, and the lead frame) are sealed by the sealing resin 40.

When the case 20 is monolithically formed by means of injection molding of the resin composition, the resin composition contains the titanium oxide fine grains 50 and the glass fibers 60 as inorganic fillers.

In the case 20, the inner surfaces of the side wall portions 20b, 20c are inclined at a prescribed angle (in the range of 0 to 6°) towards the opening portion 20f, and they are formed so that the size of the opening portion 20f is larger than that of the inner surface of the bottom wall portion 20a.

As far as the thickness of the side wall portions 20b, 20c is concerned, the thickness d1 of the portion in contact with the bottom wall portion 20a is the thickest, and the thickness gradually tapers thinner towards the opening portion 20f, so that the thickness d2 of the portion in contact with the opening portion 20f is thinner than the thickness d1 (d1>d2).

However, it may be that the side wall portions 20b, 20c are not inclined. Instead, the side wall portions 20b, 20c have an even thickness (d1=d2).

The inner surfaces of the side wall portions 20b, 20c work as reflectors that reflect the light emitted from the LED chip 30, so that the light is emitted from the opening portion 20f.

Figure 2:
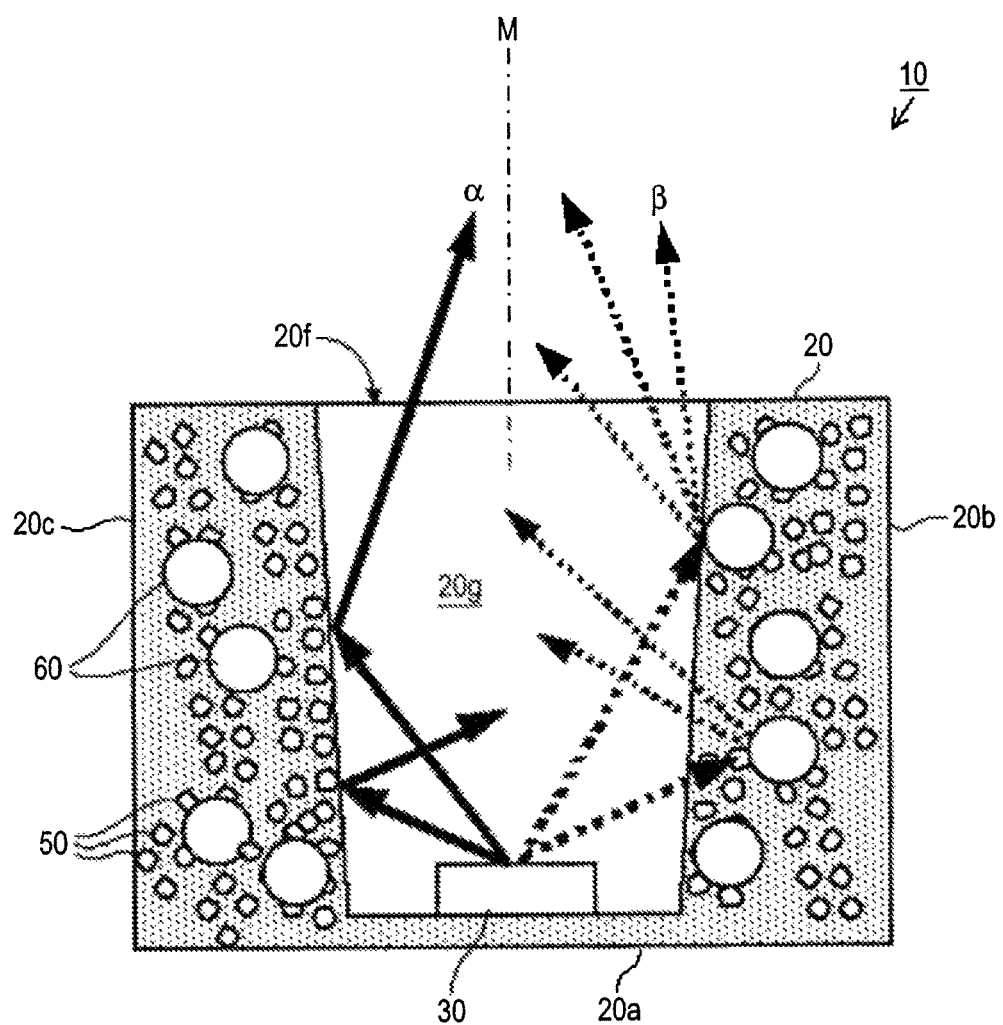
FIG. 2 is a schematic vertical cross-sectional view illustrating the state of light emitting device 10 wherein the light of LED chip 30 is reflected from the side wall portions 20b, 20c of the LED chips 20.

As shown in FIG. 2, the light emitted from the LED chip 30 is specular reflected from the titanium oxide fine grains 50 (indicated by solid line arrow α), and, at the same time, it is diffusion reflected from glass fibers 60 (indicated by solid line arrow β). The light rays that have been reflected once or more times and the light rays directly emitted from the LED chip 30 are mixed with each other and output from the opening portion 20f.

Consequently, if there is an appropriate balance between the specular reflected light and the diffusion reflected light, it is possible to display the optical specificity for the light of the LED chip 30 emitted at a high efficiency from the opening portion 20*f* in both the direction of the central axis M in the width direction of the case 20 (axial luminous intensity) and in the entire peripheral direction (total light beam) of the opening portion 20*f* of the case 20.

Figure 3:
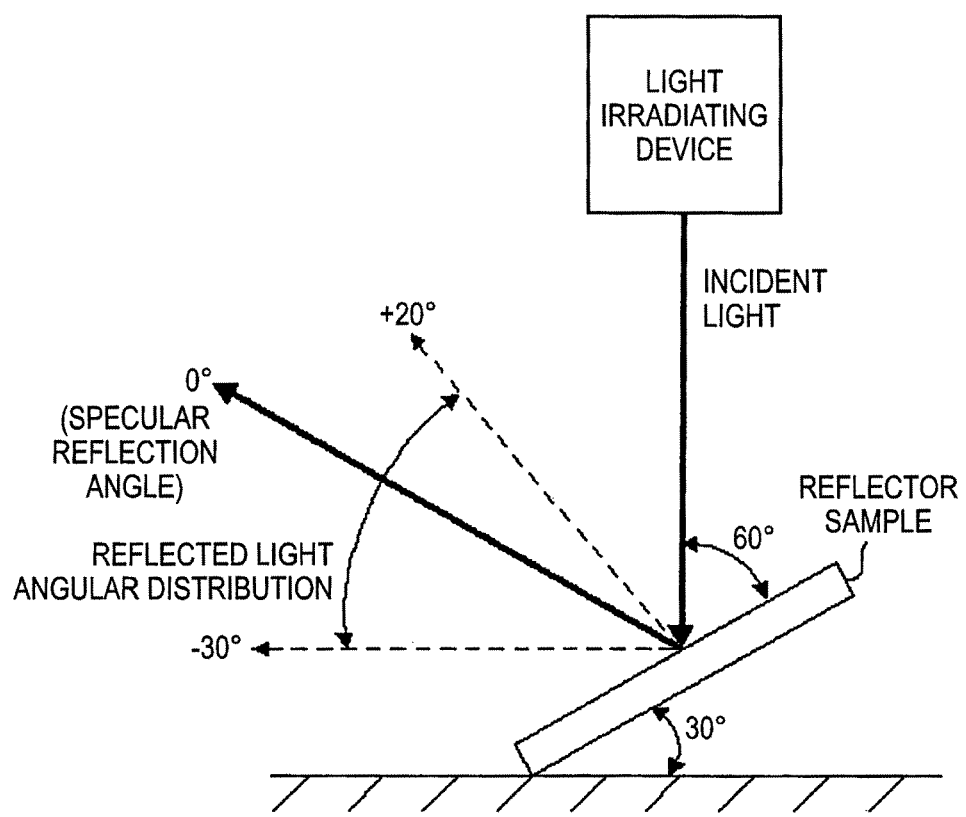
FIG. 3 is a schematic diagram illustrating the configuration of the measurement device for measuring the reflected light intensity versus the reflected light angular distribution of the reflector sample.

As shown in FIG. 3, in a measurement device for measuring the reflected light intensity with respect to the reflected light angular distribution of the reflector sample, measurement is carried out as follows: light is incident at an incidence angle of 60° on the reflector sample by means of a light irradiating device; for the reflected light from the reflector sample, when the specular reflection angle is at 0°, the reflected light angular distribution of the reflected light intensity is measured in the range from 20° towards the side of the incident light (the plus side) to 30° towards the side opposite to the incident light (minus side) (−30° to +20°).

Figure 4:
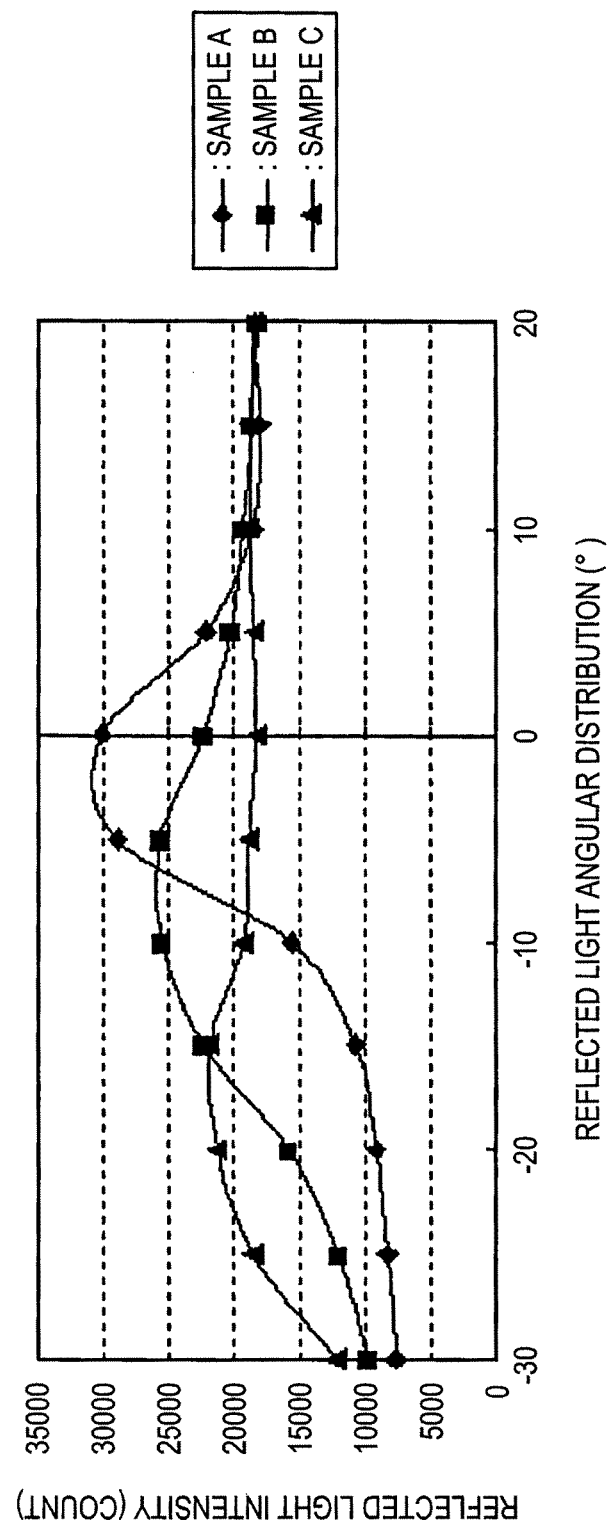
FIG. 4 is a diagram illustrating the characteristics obtained by measuring the reflected light intensity versus the reflected light angular distribution of the following samples A through C: sample A of a resin composition prepared by blending glass fibers 60 with an average length of 89 μm, sample B of a resin composition prepared by blending glass fibers 60 with an average length of 184 μm, and sample C of a resin composition prepared by blending glass fibers 60 with an average length of 223 μm.

FIG. 4 is a diagram illustrating the characteristics obtained by measuring the reflected light intensity versus the reflected light angular distribution for samples A to C: sample A of a resin composition prepared by blending glass fibers 60 with an average length of 89 μm, sample B of a resin composition prepared by blending glass fibers 60 with an average length of 184 μm, and sample C of a resin composition prepared by blending glass fibers 60 with an average length of 223 μm.

The samples A to C are prepared by using PA9T (diamine nonanoic acid+terephthalic acid) as the resin composition in processing to the shape of the case 20, with the same values of the grain size and proportion of the titanium oxide fine grains 50 added therein.

Here, the average length of the glass fibers 60 refers to the average value of the length of the glass fibers 60 mixed in plurality in the resin composition, because it is impossible to have the same length for them.

In this connection, for the side wall portions 20*b*, 20*c* of each of the samples A to C, a specimen is cut out from the same site and with the same dimensions and shape. The length of the mixed glass fibers 60 of the cut out portion is measured. The length is in the range of 50 to 150 μm for sample A, 0 to 430 μm for sample B, and 0 to 430 μm for sample C.

For sample A, the reflected light intensity at the specular reflection angle of 0° is high. However, there is a tendency that the reflected light intensity falls off drastically in the remaining angular range as it goes away from the specular reflection angle.

For samples B and C, as it is possible to obtain the same high reflected light intensity in a wide reflected light angular distribution, it is possible to display the optical specificity that is combined with a well balance of the diffusion reflected light and the specular reflected light at the same time.

The present inventors have performed the same experiment for the mixtures of resin composition prepared by mixing the glass fibers 60 with different average lengths other than the samples A to C. As a result, it is found that when the average length of the glass fibers 60 are in the range of about 150 μm to about 230 μm (the optimum range), it is possible to have excellent balance for both the diffusion reflected light and the specular reflected light, and, at the same time, it is possible to display the optical specificity.

Here, if the average length of the glass fibers 60 is longer than the optimum range, operation is undesired for both the diffusion reflection and the specular reflection, and there is a tendency that the component of transmission of the light through the side wall portions 20*b*, 20*c* of the case 20 increases. In addition, it becomes difficult to blend the additives well in the resin composition, and it is impossible to have the additives evenly dispersed and arranged in the resin composition.

On the other hand, when the average length of the glass fibers 60 is shorter than the optimum range, the specular reflected light becomes more than the diffusion reflected light, damaging the balance between the diffusion reflected light and the specular reflected light. Consequently, there is a tendency that the optical specificity can hardly be displayed.

Figure 5:
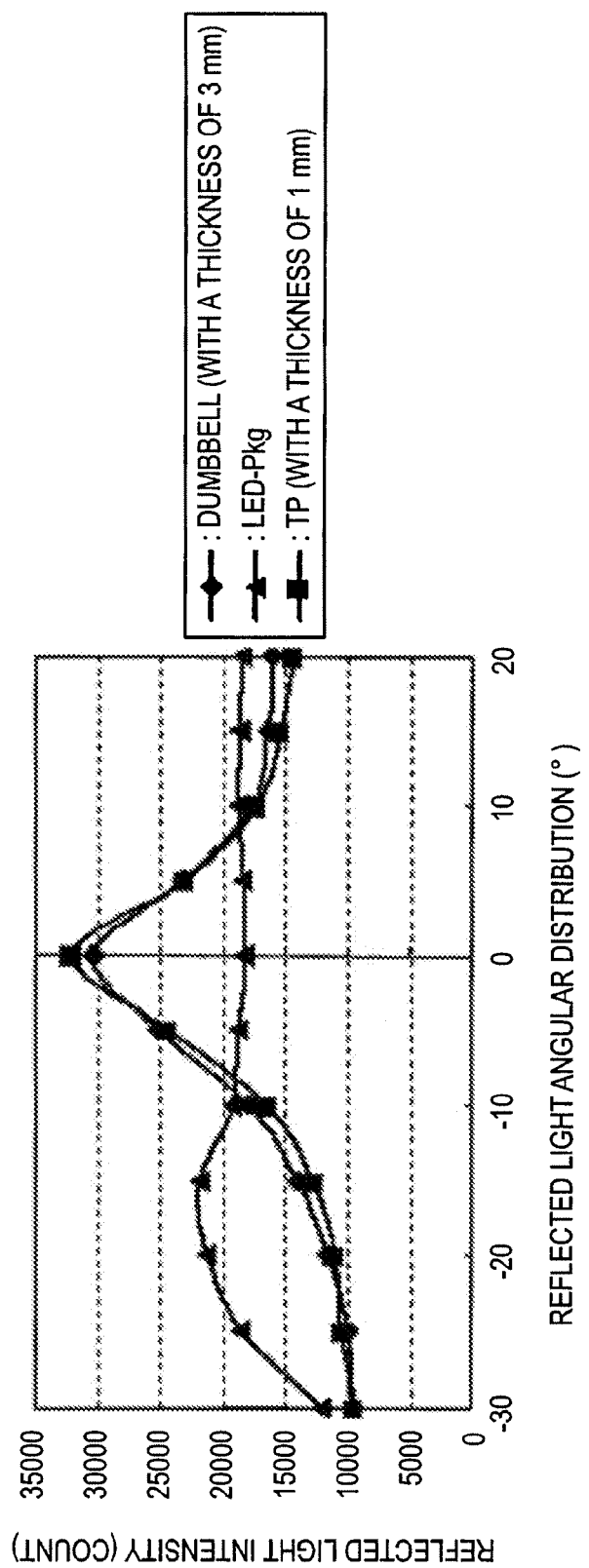
FIG. 5 is a diagram illustrating the characteristics of the reflected light intensity versus the reflected light angular distribution of the following samples: a sample (LED-Pkg) prepared by forming a case 20 with thickness d1, d2 of the side wall portions 20b, 20c in the range of about 80 μm to about 130 μm from the resin composition prepared by blending glass fibers 60 with an average length of 223 μm, the same as sample C, a sample prepared to a dumbbell shape with a thickness of the central portion of 3 mm, and a sample prepared in a rectangular shape (TP) with a thickness of 1 mm.

FIG. 5 is a diagram illustrating the characteristics as a result of measurement of the reflected light intensity versus the reflected light angular distribution of the following samples: a sample (LED-Pkg) prepared by forming a case 20 with thickness d1, d2 of the side wall portions 20*b*, 20*c* in the range of about 80 μm to about 130 μm from the resin composition prepared by blending glass fibers 60 with an average length of 223 μm, the same as sample C, a sample prepared to a dumbbell shape with a thickness of the central portion of 3 mm, and a sample prepared in a rectangular shape (TP) with a thickness of 1 mm.

The samples are prepared using PA9T as the resin composition with the same values of the grain size and proportion of the titanium oxide fine grains 50 added therein.

It can be seen that when the thickness of the sample (resin molding) becomes thicker, there is a tendency that even when the glass fibers 60 with a longer average length are used, it is still impossible to obtain the diffusion reflected light, and the reflected light is almost entirely the specular reflected light, and it becomes hard to display the optical specificity, as the diffusion reflected light and the specular reflected light are out of balance.

The reason is as follows: when the thickness of the sample is smaller than the average length of the glass fibers 60, it is easy to arrange the glass fibers 60 parallel with the length direction orthogonal to the thickness direction of the sample, so that it is easy to display the diffusion reflection characteristics.

On the other hand, if the thickness of the sample is larger than the average length of the glass fibers 60, the larger the thickness, the more difficult to arrange the glass fibers 60 parallel to the length direction of the sample, so that it hard to display the diffusion reflection characteristics.

The present inventors have carried out the same experiment using various samples with different values of thickness d1, d2 of the side wall portions 20*b*, 20*c*. As a result, it has been found that if the average length of the glass fibers 60 is in the range of about 150 μm to about 230 μm (the optimum range), when the values of thickness d1, d2 of the side wall portions 20*b*, 20*c* are in the range of about 80 μm to about 130 μm (the optimum range), good balance can be realized for the diffusion reflected light and the specular reflected light, and the optical specificity can be well displayed.

The present inventors have also performed measurement of the reflected light intensity versus the reflected light angular distribution for the samples prepared with different values of the grain size of the titanium oxide fine grains 50 and their contents in the resin composition. As a result of the aforementioned measurement, it has been found that when the titanium oxide fine grains 50 are nearly in a spherical shape with a diameter in the range of about 0.1 μm to about 0.3 μm, and the proportion of the titanium oxide fine grains in the resin composition is in the range of about 10 wt % to about 50 wt %, good balance can be realized for the diffusion reflected light and the specular reflected light, and the optical specificity can be well displayed.

In addition, as the titanium oxide fine grains 50 work as a specular reflection material, if they are dispersed and arranged in the resin composition near the inner surfaces of the side wall portions 20b, 20c of the case 20, it is possible to further improve the specular reflectivity.

On the other hand, because the glass fibers 60 work as a diffusion reflecting material, when they are almost evenly dispersed and arranged in the resin composition from near the inner surfaces of the side wall portions 20b, 20c of the case 20 to the deep portions, it is possible to further improve the diffusion reflectivity.

The present inventors have performed measurement of the reflected light intensity versus the reflected light angular distribution for the samples prepared by selecting various values of the diameter of the glass fibers 60, their content in the resin composition and their refractive index. As a result of the measurement, it has been found that when the glass fibers 60 are in the cylindrical shape with a diameter in the range of about 6 μm to about 13 μm, their content in the resin composition is in the range of about 1 wt % to about 40 wt % (or preferably in the range of about 10 wt % to about 30 wt %), and their refractive index is in the range of about 1.4 to about 1.45, it is possible to increase the strength of the side wall portions 20b, 20c of the case 20, and, at the same time, good balance can be realized for the diffusion reflected light and the specular reflected light, and the optical specificity can be well displayed.

The types of the resin composition may be any of the following types: thermoplastic resins (such as polyamide resin and LCP (liquid crystal polymer) resin, etc.), thermosetting resins (such as silicone resin, modified silicone resin, epoxy resin, modified epoxy resin, etc.). However, in order to guarantee the diffusion reflectivity of the glass fibers 60, it is preferred that the refractive index of the glass fiber is higher than that of glass fibers 60, and the refractive index of the resin composition is about 1.45 or higher.

It may be possible that the fine grains of a material with good specular reflectivity in place of the titanium oxide fine grains 50. Examples of the materials that can be used as fine grains in this case include zinc oxide, barium oxide, zinc sulfide, boron nitride, etc. Among these materials, in particular, titanium oxide is preferred as it is inexpensively available on the market, and it has a high chemical stability.

In addition, the shape of the case 20 is not limited to the flat rectangular box shape. The case 20 may have other shapes, such as a cylindrical box shape, etc.

The present invention is not limited to the aforementioned aspects and the aforementioned embodiments. Various modifications may be adopted in the range the specialists can think of as long as the gist of the present invention is observed. The papers, patent applications, publications of patents, etc. described in this specification refer to citing of their entire contents.

What is claimed is:

1. A light emitting device, comprising:
an LED chip; and
a case including an accommodating recession accommodating the LED chip,
wherein the light emitting device emits light from an opening portion of the accommodating recession;
wherein the case is monolithically formed by injection molding of a resin composition prepared by mixing fine grains of specular reflection material and glass fibers as diffusion reflecting material as fillers therein;
wherein an inner surface of a side wall portion of the case comprises a reflector that reflects the light emitted from the LED chip so that the light is output from the opening portion; and
wherein a thickness of the side wall portion is less than an average length of the glass fibers.

2. The light emitting device according to claim 1, wherein the thickness of the side wall portion is in a range of about 80 μm to about 130 μm and the average length of the glass fibers is in a range of about 150 μm to about 230 μm.

3. The light emitting device according to claim 2, wherein the thickness of the side wall portion is in a range from about 80 μm to about 95 μm.

4. The light emitting device according to claim 2, wherein the thickness of the side wall portion decreases as the average length of the glass fibers decreases.

5. The light emitting device according to claim 2, wherein the thickness of the side wall portion comprises a substantially constant thickness as the average length of the glass fibers increases.

6. The light emitting device according to claim 1, wherein the case includes a flat rectangular box shape, the side wall faces a width direction of the case, and light is emitted from the opening portion of the accommodating recession in a direction of the side surface of the light emitting device.

7. The light emitting device according to claim 1, wherein the fine grains of the specular reflection material are dispersed and arranged in the resin composition near the inner surface of the side wall portion, and the glass fibers are substantially evenly dispersed and arranged in the resin composition from near the inner surface of the side wall portion to a deep portion.

8. The light emitting device according to claim 1, wherein the glass fibers are in a cylindrical shape with a diameter in a range of about 6 μm to about 13 μm, a proportion of the glass fibers in the resin composition is in a range of about 1 wt % to about 40 wt %, and a refractive index of the glass fibers is less than a refractive index of the resin composition.

9. The light emitting device according to claim 8, wherein the refractive index of the glass fibers is in a range from about 1.4 to about 1.45.

10. The light emitting device according to claim 8, wherein an amount of the glass fibers in the resin composition is in a range from about 10 wt % to about 30 wt %.

11. The light emitting device according to claim 1, wherein the fine grains of the specular reflection material are in a substantially spherical shape with a diameter in a range of about 0.1 μm to about 0.3 μm, and a proportion of the fine grains of the specular reflection material in the resin composition is in a range of about 10 wt % to about 50 wt %.

12. The light emitting device according to claim 1, wherein the inner surface of the side wall portion of the case is inclined in a range of zero degrees to six degrees.

13. The light emitting device according to claim 1, wherein the glass fibers are arranged parallel with a length direction orthogonal to a thickness direction of the side wall portion.

14. The light emitting device according to claim 1, wherein the thickness of the side wall portion is less than 100 μm and the average length of the glass fibers is in a range from about 150 μm to about 230 μm.

15. The light emitting device according to claim 1, wherein the glass fibers are in a cylindrical shape with a diameter comprising about 6 μm to about 13 μm, an amount of the glass fibers in the resin composition is in a range from about 10 wt % to about 30 wt %, and a refractive index of the glass fibers is less than a refractive index of the resin composition.

* * * * *